United States Patent
Lin et al.

(10) Patent No.: US 11,716,842 B2
(45) Date of Patent: Aug. 1, 2023

(54) RANDOM BIT CIRCUIT CAPABLE OF COMPENSATING THE PROCESS GRADIENT

(71) Applicant: eMemory Technology Inc., Hsin-Chu (TW)

(72) Inventors: Shiau-Pin Lin, Hsinchu County (TW); Chih-Min Wang, Hsinchu County (TW)

(73) Assignee: eMemory Technology Inc., Hsin-Chu (TW)

( * ) Notice: Subject to any disclaimer, the term of this patent is extended or adjusted under 35 U.S.C. 154(b) by 409 days.

(21) Appl. No.: 17/035,773

(22) Filed: Sep. 29, 2020

(65) Prior Publication Data

US 2021/0149636 A1    May 20, 2021

Related U.S. Application Data

(60) Provisional application No. 62/935,093, filed on Nov. 14, 2019.

(51) Int. Cl.
| | |
|---|---|
| *H10B 41/35* | (2023.01) |
| *H01L 29/788* | (2006.01) |
| *G06F 7/58* | (2006.01) |
| *H03K 3/84* | (2006.01) |
| *H01L 49/02* | (2006.01) |

(52) U.S. Cl.
CPC ............. *H10B 41/35* (2023.02); *G06F 7/588* (2013.01); *H01L 28/40* (2013.01); *H01L 29/7884* (2013.01); *H03K 3/84* (2013.01)

(58) Field of Classification Search
CPC .................................. G06F 7/588; H03K 3/84
See application file for complete search history.

(56) References Cited

U.S. PATENT DOCUMENTS

| | | | |
|---|---|---|---|
| 9,489,999 B2 | 11/2016 | Rosenberg | |
| 9,997,244 B1 | 6/2018 | Chih | |
| 10,103,895 B1 | 10/2018 | Tseng | |
| 10,439,829 B1 | 10/2019 | Lin | |
| 10,460,780 B2 | 10/2019 | Kim | |
| 2015/0071432 A1 | 3/2015 | Zhu | |
| 2015/0268934 A1* | 9/2015 | Anderson | G06F 7/588 708/250 |
| 2017/0090873 A1 | 3/2017 | Clark | |

FOREIGN PATENT DOCUMENTS

| | | |
|---|---|---|
| CN | 105518786 A | 4/2016 |
| WO | 2019/125684 A1 | 6/2019 |

* cited by examiner

*Primary Examiner* — Michael D. Yaary
(74) *Attorney, Agent, or Firm* — Winston Hsu

(57) ABSTRACT

A random bit circuit includes four storage cells controlled by four different word lines. The first storage cell and the second storage cell are disposed along a first direction sequentially, and the first storage cell and the third storage cell are disposed along a second direction sequentially. The third storage cell and the fourth storage cell are disposed along the first direction sequentially. The first storage cell and the fourth storage cell are coupled in series, and the second storage cell and the third storage cell are coupled in series.

13 Claims, 8 Drawing Sheets

RANDOM BIT CIRCUIT CAPABLE OF COMPENSATING THE PROCESS GRADIENT

CROSS REFERENCE TO RELATED APPLICATIONS

This non-provisional application claims priorities of U.S. provisional application No. 62/935,093, filed on Nov. 14, 2019, included herein by reference in its entirety.

BACKGROUND OF THE INVENTION

1. Field of the Invention

The present invention is related to a random bit circuit, and more particularly to a random bit circuit capable of compensating the process gradient.

2. Description of the Prior Art

To prevent electronic devices from being accessed by unauthorized personnel, manufacturers of electronic devices often need to invest a significant amount of time and money to develop countermeasures to avoid external threats. For example, the physical unclonable function (PUF) circuit is often applied to protect the system from physical attacks and reverse engineering due to the intrinsic characteristics of the PUF circuit. The PUF circuit can generate random bits based on unpredictable physical characteristics.

However, although the physical unclonable function circuits can generate random bits based on their physical characteristics, the randomness of the random bits is not always acceptable. For example, since the manufacturing process is not perfect, the process gradient can be significant, resulting in that some of the physical unclonable function circuits tend to generate random bits having values of "1" and some other physical unclonable function circuits tend to generate random bits having values of "0".

SUMMARY OF THE INVENTION

One embodiment of the present invention discloses a random bit circuit. The random bit circuit includes a first storage cell, a second storage cell, a third storage cell, and a fourth storage cell.

The first storage cell has a first terminal, a second terminal, and a control terminal coupled to a first word line. The second storage cell has a first terminal, a second terminal, and a control terminal coupled to a second word line. The third storage cell has a first terminal coupled to the second terminal of the second storage cell, a second terminal, and a control terminal coupled to a third word line. The fourth storage cell has a first terminal coupled to the second terminal of the first storage cell, a second terminal, and a control terminal coupled to a fourth word line.

The first storage cell and the second storage cell are adjacent to each other and disposed along a first direction. The first storage cell and the third storage cell are adjacent to each other and disposed along a second direction perpendicular to the first direction. The third storage cell and the fourth storage cell are adjacent to each other and disposed along the first direction.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
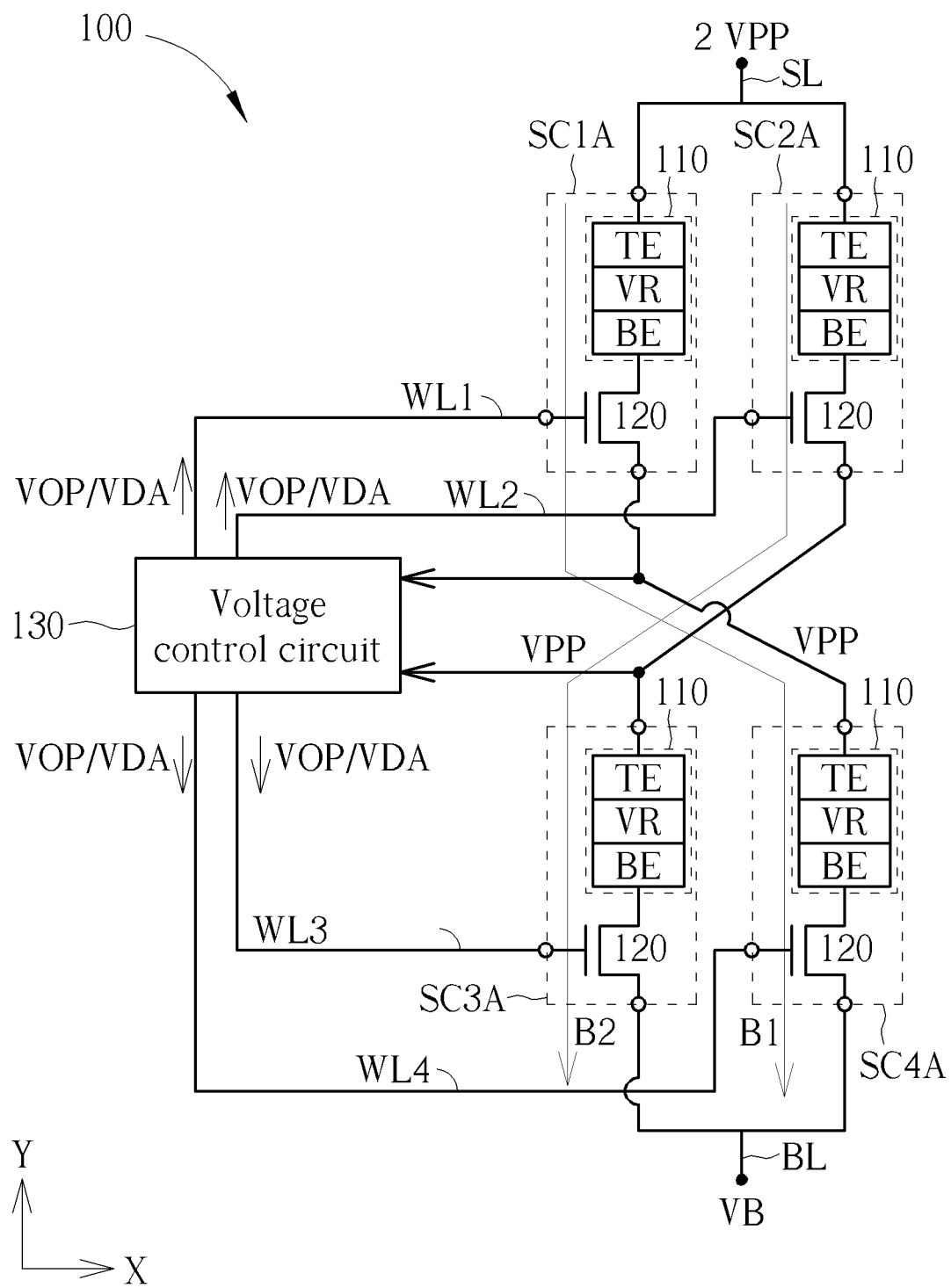
FIG. 1 shows a random bit circuit according to one embodiment of the present invention.

FIG. 1 shows a random bit circuit 100 according to one embodiment of the present invention. The random bit circuit 100 includes storage cells SC1A, SC2A, SC3A, and SC4A.

The storage cell SC1A has a first terminal, a second terminal, and a control terminal coupled to a word line WL1. The storage cell SC2A has a first terminal, a second terminal, and a control terminal coupled to a word line WL2. The storage cell SC3A has a first terminal coupled to the second terminal of the storage cell SC2A, a second terminal, and a control terminal coupled to a word line WL3. The storage cell SC4A has a first terminal coupled to the second terminal of the storage cell SC1A, a second terminal, and a control terminal coupled to a word line WL4.

Also, the first terminal of the storage cell SC1A and the first terminal of the storage cell SC2A can be coupled to a source line SL. Also, the second terminal of the storage cell SC3A and the second terminal of the storage cell SC4A can be coupled to a bit line BL.

In some embodiments, the storage cells SC1A, SC2A, SC3A, and SC4A can be resistive random-access memory (ReRAM) cells and can have the same structure. For example, the storage cell SC1A can include a resistive element 110 and a select transistor 120.

The resistive element 110 has a top electrode TE coupled to the first terminal of the storage cell SC1A, a bottom electrode BE, and a variation resistance layer VR disposed between the top electrode TE and the bottom electrode BE. The select transistor 120 has a first terminal coupled to the bottom electrode BE of the resistive element 110, a second terminal coupled to the second terminal of the storage cell SC1A, and a control terminal coupled to the control terminal of the storage cell SC1A.

In FIG. 1, the storage cell SC1A and the storage cell SC2A are adjacent to each other and disposed along a first direction X. Also, the storage cell SC1A and the storage cell SC3A are adjacent to each other and disposed along a second direction Y perpendicular to the first direction X, and the storage cell SC3A and the storage cell SC4A are adjacent to each other and disposed along the first direction X. In this case, the storage cell SC1A and the storage cell SC4A are coupled in series in a first branch B1 while the storage cell SC2A and the storage cell SC3A are coupled in series in a second branch B2. In some embodiments, the random bit circuit 100 can be enrolled by programming storage cells in these two branches, and the program conditions of the storage cells in these two branches can be used to represent the value of the random bit.

During the enroll operation, the source line SL can receive a program voltage 2VPP, and the bit line BL can receive a system reference voltage VB. Also, the word lines WL1, WL2, WL3, and WL4 can receive an operation voltage VOP, so the select transistors 120 of the storage cells SC1A, SC2A, SC3A, and SC4A can be turned on during the enroll operation.

In some embodiments, if the storage cells SC1A, SC2A, SC3A, and SC4A are not programmed, the resistive elements 110 in the storage cells SC1A, SC2A, SC3A, and SC4A will have great resistance. In this case, the program voltage 2VPP will be divided by the storage cell SC1A and the storage cell SC4A in the first branch B1, and will be divided by the storage cell SC2A and the storage cell SC3A in the second branch B2. In some embodiments, since the resistance of the storage cells SC1A, SC2A, SC3A, and SC4A are substantially the same before being programmed, the cross voltage applied to each of the storage cells SC1A, SC2A, SC3A, and SC4A would be the same. That is, the voltages at the second terminals of the storage cells SC1A and SC2A can be VPP (2VPP/2). In this case, if the voltage VPP is high enough to program a storage cell, then each of the storage cells SC1A, SC2A, SC3A, and SC4A would be at the same condition in which the storage cell is possible to be programmed.

However, due to the differences between the physical characteristics of the storage cells SC1A, SC2A, SC3A, and SC4A, some of the storage cells may be programmed sooner. For example, if the storage cell SC3A is programmed first, the resistance of the resistive element 110 in the storage cell SC3A will drop significantly, pulling down the voltage at the second terminal of the storage cell SC2A. Therefore, the voltage between the first terminal and the second terminal of the storage cell SC2A will increase, so the storage cell SC2A will have greater tendency to be programmed. Furthermore, once the storage cell SC2A and the storage cell SC3A are programmed, the current flowing along the second branch B2 will increase due to the resistance drop of the storage cell SC2A and the storage cell SC3A. Since the program voltage 2VPP is usually generated by a charge pump, which has limited driving ability, the increased current on the second branch B2 will pull down the level of the program voltage 2VPP, preventing the storage cells SC1A and SC4A from being programmed. In some embodiments, the drop of the program voltage 2VPP can also be sensed to determine if the enroll operation has completed or not.

On the other hand, if the storage cell SC1A is programmed first, the resistance of the resistive element 110 in the storage cell SC1A will drop significantly, and the voltage at the first terminal of the storage cell SC4A will increase. Therefore, the voltage between the first terminal and the second terminal of the storage cell SC4A will increase, so the storage cell SC4A will have greater tendency to be programmed. Furthermore, once the storage cell SC1A and the storage cell SC4A are programmed, the current flowing along the second branch B1 will increase due to the resistance drop of the storage cell SC1A and the storage cell SC4A. Consequently, the program voltage 2VPP will be pulled down, thereby preventing the storage cells SC2A and SC3A from being programmed.

In FIG. 1, the random bit circuit 100 can further include a voltage control circuit 130 coupled to the second terminal of the storage cell SC1A, the second terminal of the storage cell SC2A, and the word lines WL1, WL2, WL3, and WL4. The voltage control circuit 130 can detect the voltage at the second terminal of the storage cell SC1A and the voltage at the second terminal of the storage cell SC2A during the enroll operation. If the voltage at the second terminal of the storage cell SC2A changes significantly, either increasing or decreasing, it may imply that one of the storage cell SC2A and the storage cell SC3A is programmed. In this case, the voltage control circuit 130 can apply a disable voltage VDA to the word lines WL1 and WL4 to turn off the select transistors 120 of the storage cell SC1A and the storage cell SC4A, preventing the storage cells SC1A and SC4A from being programmed. Similarly, if the voltage at the second terminal of the storage cell SC1A changes significantly, it may imply that one of the storage cell SC1A and the storage cell SC4A is programmed. In this case, the voltage control circuit 130 can apply the disable voltage VDA to the word lines WL2 and WL3 to turn off select transistors 120 of the storage cell SC2A and the storage cell SC3A, preventing the storage cells SC2A and SC3A from being programmed.

However, in some embodiments, if the program voltage 2VPP can be pulled down by the current generated by the programmed storage cells in one branch soon enough to prevent the storage cells in another branch from being programmed, then the voltage control circuit 130 may be omitted according to the system requirement.

After the enroll operation, storage cells in one of the two branches B1 and B2 of the random bit circuit 100 will be programmed while storage cells in another branch of the random bit circuit 100 will not be programmed. Therefore, the value of the random bit generated by the random bit circuit 100 after the enroll operation can be determined according to the program conditions of the storage cells SC1A, SC2A, SC3A, and SC4A on the two branches B1 and B2.

Figure 2:
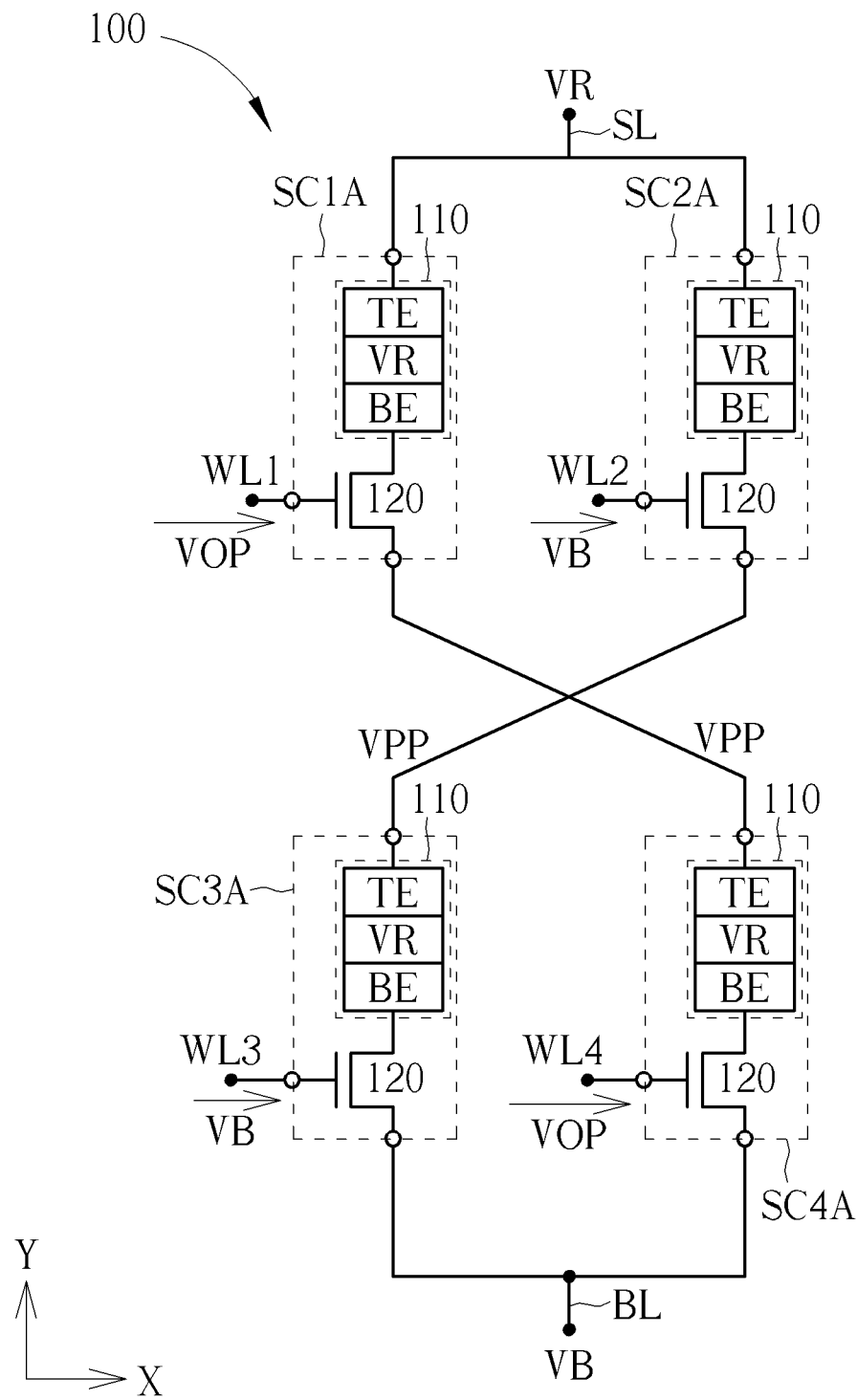
FIG. 2 shows the read operation of the random bit cell in FIG. 1.

FIG. 2 shows the read operation of the random bit cell 100. In FIG. 2, the source line SL can receive a read voltage VR, and the bit line BL can receive the system reference voltage VB. Furthermore, the word lines WL1 and WL4 can receive the operation voltage VOP for turning on the select transistors 120 in the storage cells SC1A and SC4A. Also, the word lines WL2 and WL3 can be at the system reference voltage VB, so the select transistors 120 in the storage cells SC2A and SC3A can be turned off. In some embodiments, the system reference voltage VB and the disable voltage VDA can be the same. That is, during the read operation, the select transistors 120 of the storage cell SC1A and the storage cell SC4A can be turned on while the select transistors 120 of the storage cell SC2A and the storage cell SC3A can be turned off. In this case, if the storage cells SC1A and SC4A are programmed after the enroll operation, a significant current would be generated along the first branch B1 to the bit line BL. However, if the storage cells SC1A and SC4A are not programmed after the enroll operation, no significant current will be generated along the first branch B1 to the bit line BL. Therefore, the random bit generated by the random bit circuit 100 can be read by sensing a current on the bit line BL. For example, if a significant current is sensed on the bit line BL during the read operation, the value of the random bit can be "1". However, if no significant current is sensed on the bit line BL during the read operation, the value of the random bit can be "0".

Furthermore, since the storage cells SC1A, SC2A, SC3A, and SC4A are arranged in a centroid symmetrical manner, the two branches B1 and B2 would include storage cells disposed in different positions. Therefore, the programming tendencies of the storage cells caused by process gradients across different positions can be compensated.

For example, if the process gradient is distributed along the first direction X, the programming tendencies of the storage cells SC1A and SC3A may be different from the programming tendencies of the storage cells SC2A and SC4A. However, the storage cells SC1A and SC3A are manufactured in more similar conditions and have more similar programming tendencies. Also, the storage cells SC2A and SC4A are manufactured in more similar conditions and have more similar programming tendencies. That is, in each of the two branches B1 and B2, one storage cell has a stronger programming tendency, namely, easier to be programmed, and the other storage cell has a weaker programming tendency. Therefore, the probability for the storage cells in the first branch B1 to be programmed during the enroll operation will still be very similar to the probability for the storage cells in the second branch B2 to be programmed during the enroll operation. Consequently, the value of the random bit is still unpredictable even with significant process gradients.

Also, if the process gradient is distributed along the second direction Y, the programming tendencies of the storage cells SC1A and SC2A may be different from the programming tendencies of the storage cells SC3A and SC4A. However, the storage cells SC1A and SC2A may still have similar programming tendencies, and the storage cells SC3A and SC4A may have similar programming tendencies. That is, in each of the two branches B1 and B2, one storage cell has a stronger programming tendency, that is, easier to be programmed, and the other storage cell has a weaker programming tendency. Therefore, the value of the random bit is still unpredictable.

That is, since the storage cells SC1A, SC2A, SC3A, and SC4A are arranged in two different branches with a centroid symmetrical manner, the programming tendencies of the storage cells caused by process gradients across different positions can be compensated, thereby ensuring the randomness of the random bit generated by the random bit circuit 100 in different manufacturing conditions.

In FIG. 1, the storage cells SC1A, SC2A, SC3A, and SC4A can be resistive random-access memory cells. However, in some other embodiments, the storage cells SC1A, SC2A, SC3A, and SC4A can be implemented by a different type of memory cells.

Figure 3:
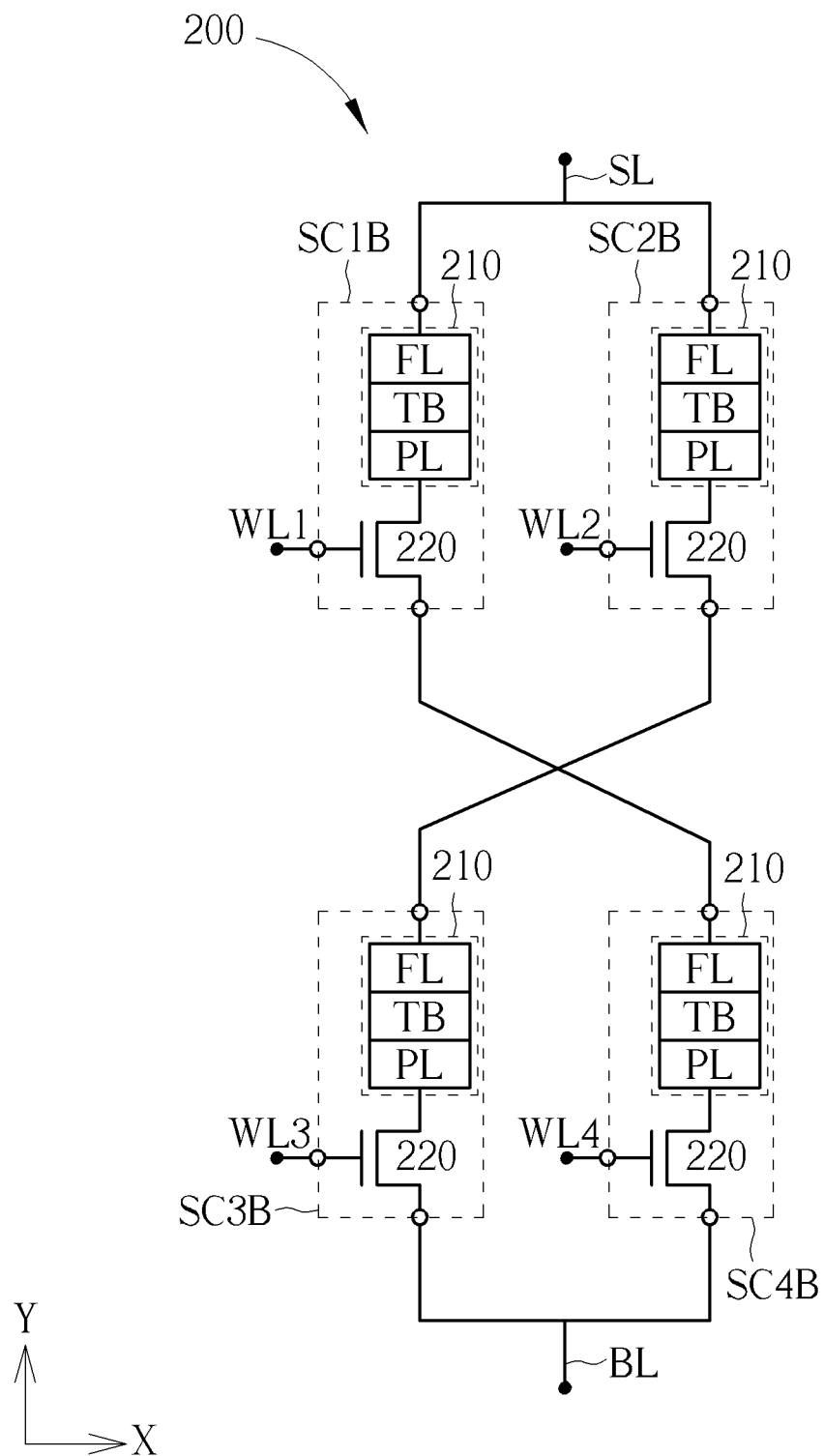
FIG. 3 shows a random bit circuit according to another embodiment of the present invention.

FIG. 3 shows a random bit circuit 200 according to one embodiment of the present invention. The random bit circuit 200 and the random bit circuit 100 have similar structures and can be operated by similar principles. However, the storage cells SC1B, SC2B, SC3B, and SC4B of the random bit circuit 200 can be magnetic random-access memory (MRAM) cells. For example, the storage cell SC1B includes a magnetic element 210 and a select transistor 220. The magnetic element 210 has a free layer FL coupled to the first terminal of the storage cell SC1B, a pinned layer PL, and a tunnel barrier layer TB disposed between the free layer FL and the pinned layer PL. The select transistor 220 has a first terminal coupled to the pinned layer PL of the magnetic element 210, a second terminal coupled to the second terminal of the storage cell SC1B, and a control terminal coupled to the control terminal of the storage cell SC1B.

In some embodiments, the storage cells SC1B, SC2B, SC3B, and SC4B have similar behaviors as the storage cells SC1A, SC2A, SC3A, and SC4A. For example, the storage cells SC1B, SC2B, SC3B, and SC4B can be programmed by high voltage, and the resistance will decrease after being programmed. Therefore, the enroll operation and the read operation used by the random bit circuit 100 can also be applied to the random bit circuit 200 by adjusting the level of the voltages accordingly.

Figure 4:
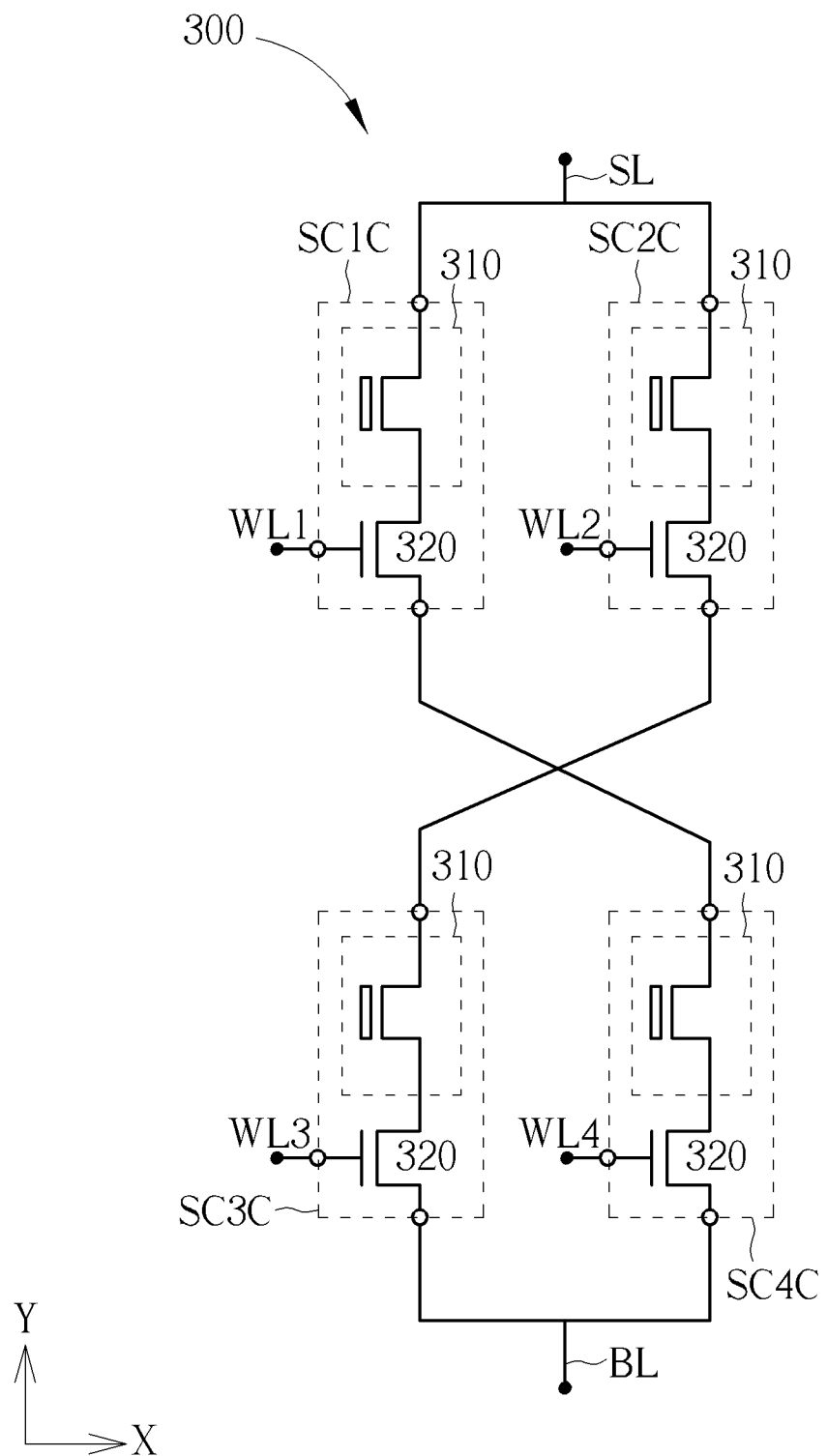
FIG. 4 shows a random bit circuit according to another embodiment of the present invention.

FIG. 4 shows a random bit circuit 300 according to one embodiment of the present invention. The random bit circuit 300 and the random bit circuit 100 have similar structures and can be operated by similar principles. However, the storage cells SC1C, SC2C, SC3C, and SC4C of the random bit circuit 300 can be flash memory cells. For example, the storage cell SC1C includes a stacked gate transistor 310 and a select transistor 320. The stacked gate transistor 310 has a first terminal coupled to the first terminal of the storage cell SC1C, a second terminal, and a control gate terminal. The select transistor 320 has a first terminal coupled to the second terminal of the stacked gate transistor 310, a second terminal coupled to the second terminal of the storage cell SC1C, and a control terminal coupled to the control terminal of the storage cell SC1C.

In some embodiments, the storage cells SC1C, SC2C, SC3C, and SC4C have similar behaviors as the storage cells SC1A, SC2A, SC3A, and SC4A. For example, the storage cells SC1C, SC2C, SC3C, and SC4C can be programmed by a high voltage, and the resistance will decrease after being programmed. Therefore, the enroll operation and the read operation used by the random bit circuit 100 can also be applied to the random bit circuit 300 by adjusting the level of the voltages accordingly.

Figure 5:
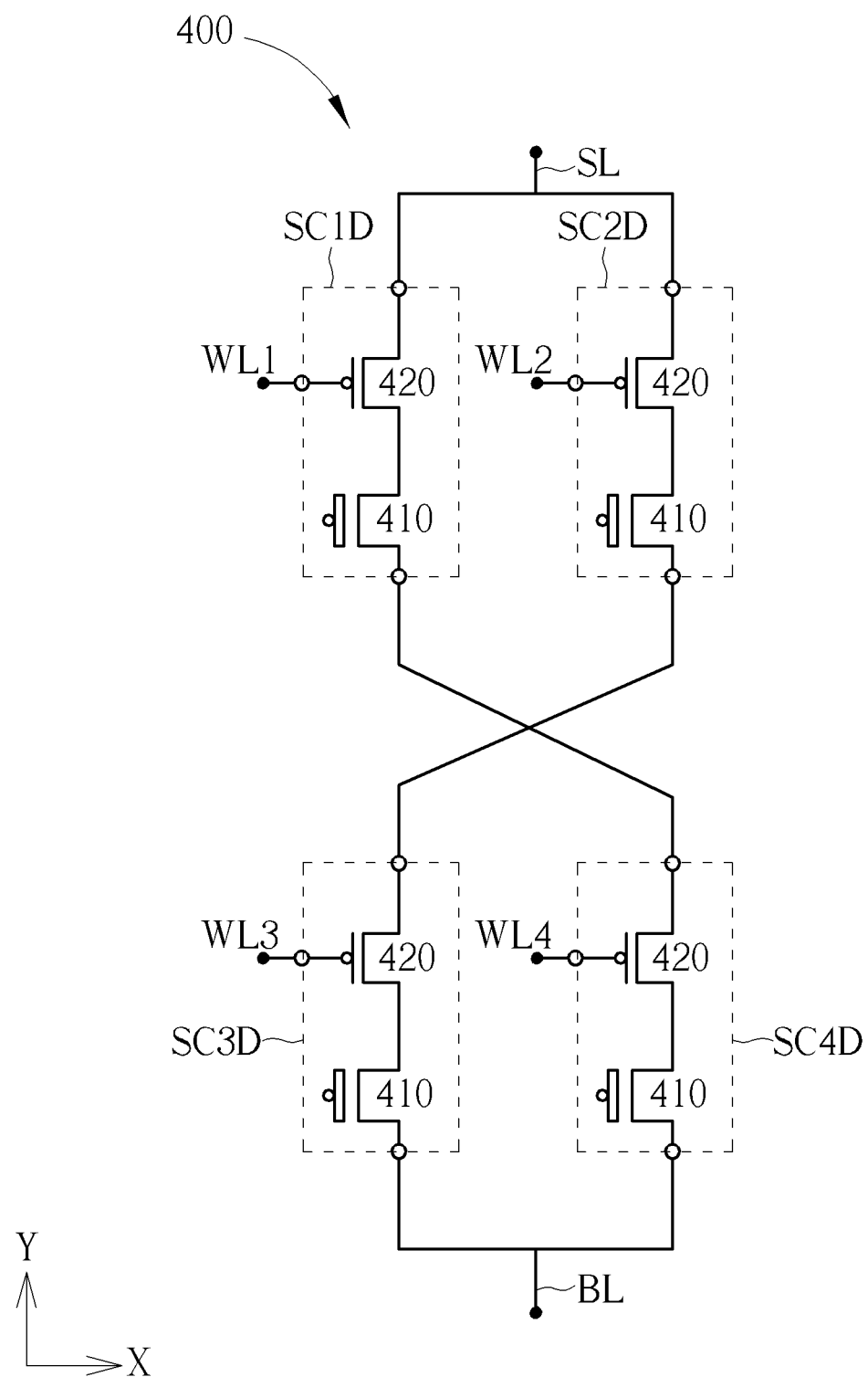
FIG. 5 shows a random bit circuit according to another embodiment of the present invention.

FIG. 5 shows a random bit circuit 400 according to one embodiment of the present invention. The random bit circuit 400 and the random bit circuit 100 have similar structures and can be operated by similar principles. However, the storage cells SC1D, SC2D, SC3D, and SC4D of the random bit circuit 400 can be non-volatile memory cells. For example, the storage cell SC1D includes a floating gate transistor 410 and a select transistor 420. The select transistor 420 has a first terminal coupled to the first terminal of the storage cell SC1D, a second terminal, and a control terminal coupled to the control terminal of the storage cell SC1D. The floating gate transistor 410 has a first terminal coupled to the second terminal of the select transistor 420, a second terminal coupled to the second terminal of the storage cell SC1D, and a floating gate terminal.

In some embodiments, the storage cells SC1D, SC2D, SC3D, and SC4D have similar behaviors as the storage cells SC1A, SC2A, SC3A, and SC4A. For example, the storage cells SC1D, SC2D, SC3D, and SC4D can be programmed by hot electrons injection to the floating gate transistors 410 with high voltages, and the resistance will decrease after being programmed. Therefore, the enroll operation and the read operation used by the random bit circuit 100 can also be applied to the random bit circuit 400 by adjusting the level of the voltages accordingly.

Figure 6:
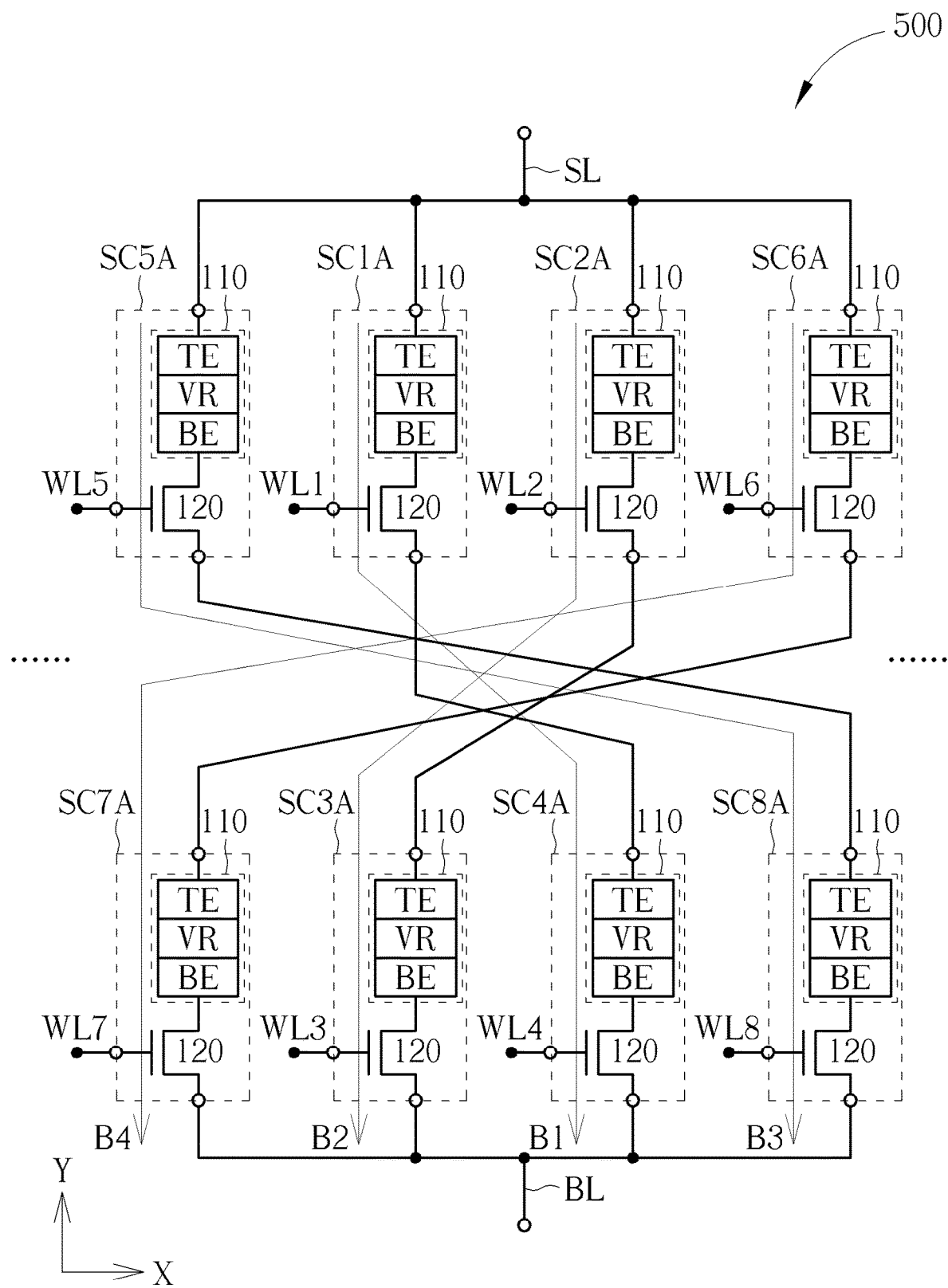
FIG. 6 shows a random bit circuit according to another embodiment of the present invention.

In addition, in some embodiments, to further compensate the effect caused by the process gradient, the centroid symmetric structure can be further extended. FIG. 6 shows a random bit circuit 500 according to one embodiment of the present invention.

The random bit circuit 500 and the random bit circuit 100 have similar structures and can be operated by similar principles. However, the random bit circuit 500 further includes storage cells SC5A, SC6A, SC7A and SC8A. The storage cell SC5A has a first terminal coupled to the source line SL, a second terminal, and a control terminal coupled to a word line WL5. The storage cell SC6A has a first terminal coupled to the source line SL, a second terminal, and a control terminal coupled to a word line WL6. The storage cell SC7A has a first terminal coupled to the second terminal of the storage cell SC6A, a second terminal coupled to the bit line BL, and a control terminal coupled to a word line WL7. The storage cell SC8A has a first terminal coupled to the second terminal of the storage cell SC5A, a second terminal coupled to the bit line BL, and a control terminal coupled to a word line WL8.

In this case, the storage cells SC1A and SC4A are in the same branch B1, the storage cells SC2A and SC3A are in the same branch B2, the storage cells SC5A and SC8A are in the same branch B3, and the storage cells SC6A and SC7A are in the same branch B4.

In some embodiments, during the read operation, storage cells in the branches B1 and B4 can be turned on while storage cells in the branches B2 and B3 can be turned off. That is, if both of the storage cells in the branch B1 or B4 are programmed, the random bit can be assigned to have value "1". Otherwise, the random bit can be assigned to have value "0". However, in some other embodiments, the value of the random bit may be determined according to different configuration of branches.

Also, in FIG. 6, the storage cells SC5A, SC1A, SC2A, and SC6A are disposed sequentially along the first direction X. Also, the storage cells SC7A, SC3A, SC4A, and SC8A are disposed sequentially along the first direction X. Since the storage cells SC1A to SC8A can cover a wider range along the direction X, the random bit circuit 500 can have better immunity to the process gradient in terms of generating unpredictable random bits. Furthermore, in some other embodiments, the random bit circuit 500 can further include more branches of storage cells along the first direction X and arranged in a centroid symmetrical manner so as to compensate the process gradient.

Figure 7:
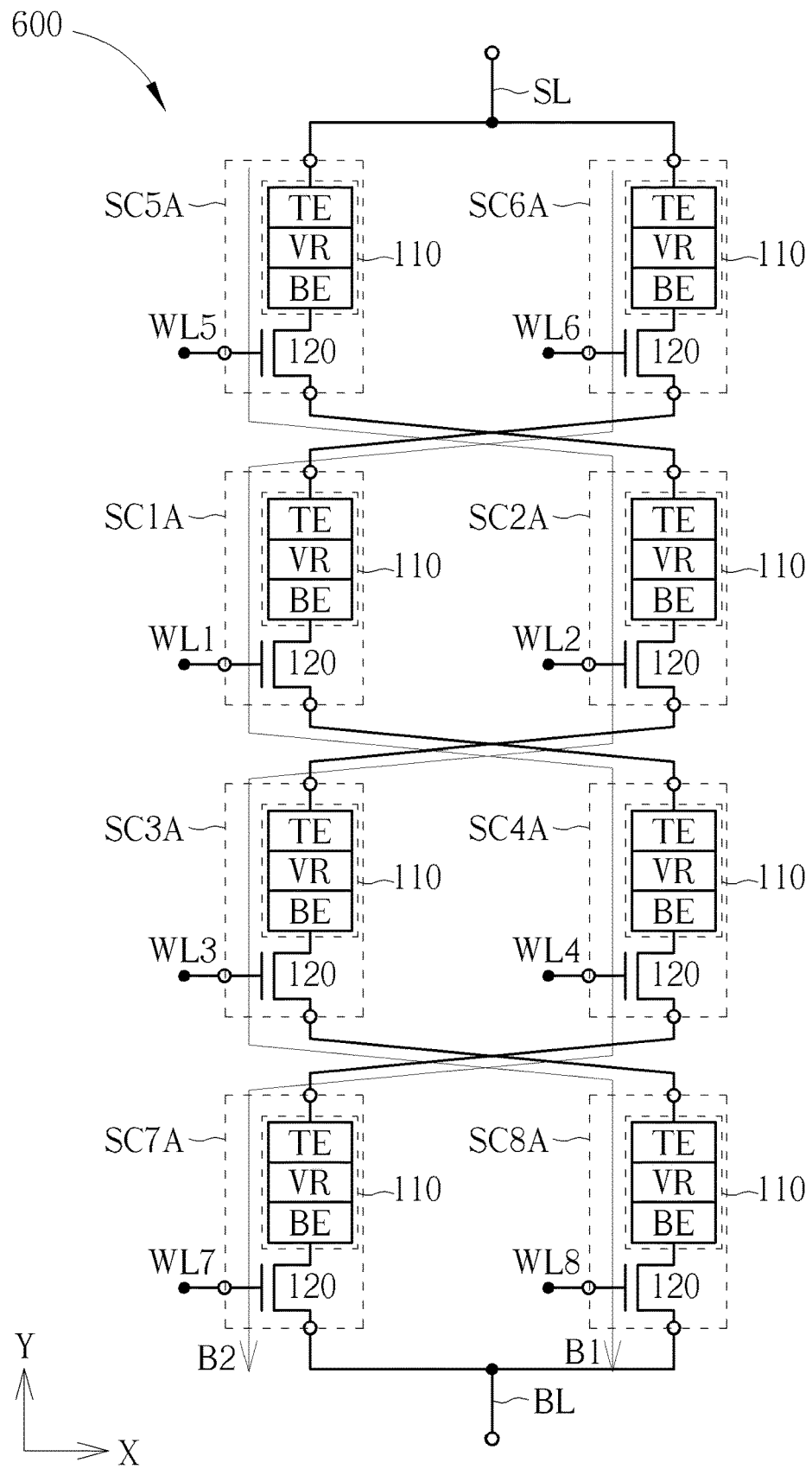
FIG. 7 shows a random bit circuit according to another embodiment of the present invention.

FIG. 7 shows a random bit circuit 600 according to one embodiment of the present invention. The random bit circuit 600 and the random bit circuit 100 have similar structures and can be operated by similar principles. However, the random bit circuit 600 further includes storage cells SC5A, SC6A, SC7A and SC8A. The storage cell SC5A has a first terminal coupled to the source line SL, a second terminal coupled to the first terminal of the storage cell SC2A, and a control terminal coupled to a word line WL5. The storage cell SC6A has a first terminal coupled to the source line SL, a second terminal coupled to the first terminal of the storage cell SC1, and a control terminal coupled to a word line WL6. The storage cell SC7 has a first terminal coupled to the second terminal of the storage cell SC4A, a second terminal coupled to the bit line BL, and a control terminal coupled to a word line WL7. The storage cell SC8 has a first terminal coupled to the second terminal of the storage cell SC3A, a second terminal coupled to the bit line BL, and a control terminal coupled to a word line WL8.

In this case, the storage cells SC5A, SC2A, SC3A, and SC8A are in the same branch B1, and the storage cells SC6A, SC1A, SC4A, and SC7A are in the same branch B2. Furthermore, the storage cells SC5A, SC1A, SC3A, and SC7A are disposed sequentially along the second direction Y. Also, the storage cells SC6A, SC2A, SC4A, and SC8A are disposed sequentially along the second direction Y.

Since the storage cells SC1A to SC8A can cover a wider range along the second direction Y, the random bit circuit 600 can have better immunity to the process gradient in terms of generating unpredictable random bits.

Furthermore, in some other embodiments, the random bit circuit 600 can further include more storage cells along the two branches B1 and B2 and arranged in a centroid symmetrical manner so as to have better immunity against the process gradient. Nevertheless, the random bit circuit 600 can include even more branches of the storage cells along the first direction X so as to compensate the uniformity caused by the process gradient in different directions.

Figure 8:
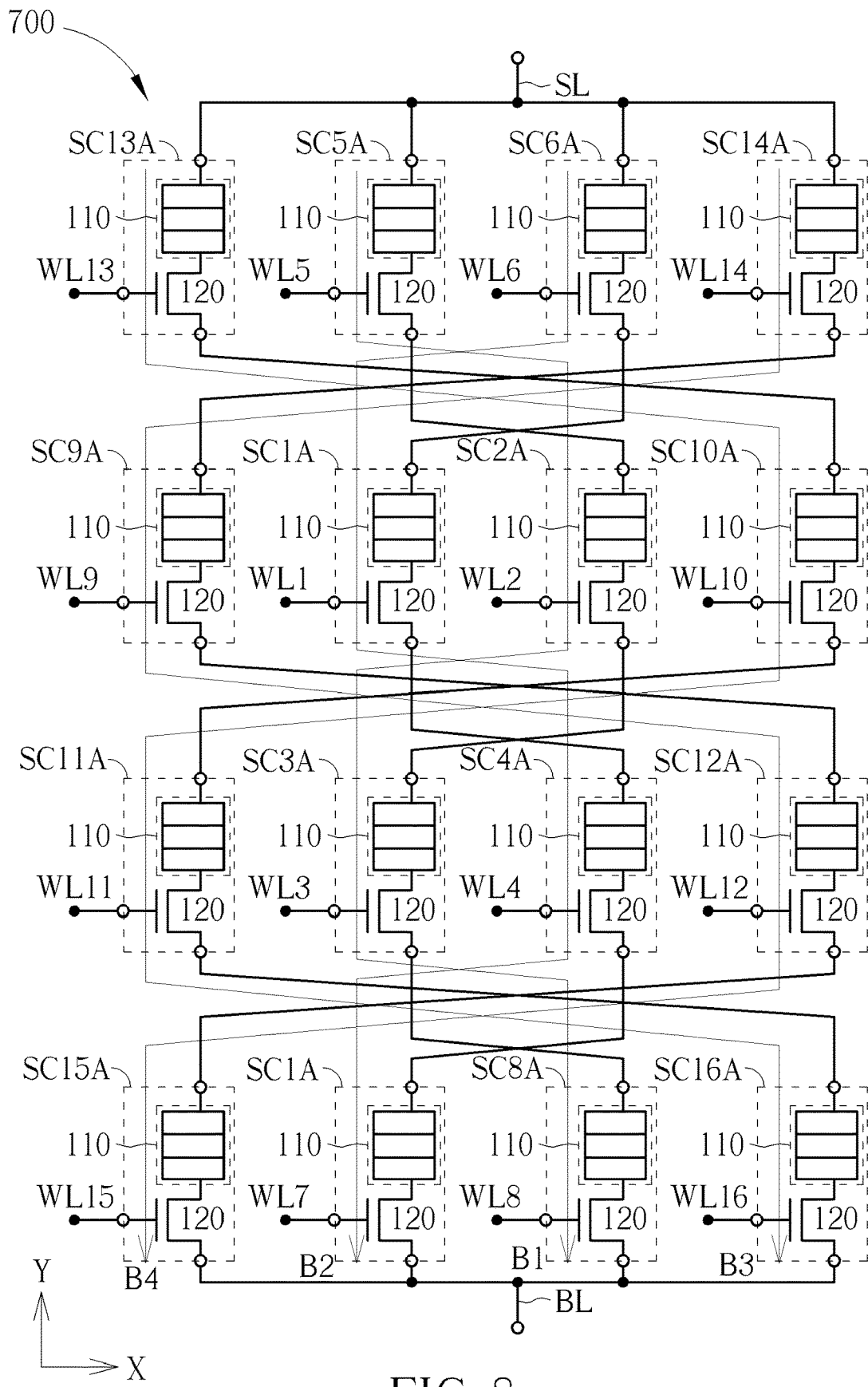
FIG. 8 shows a random bit circuit according to another embodiment of the present invention.

FIG. 8 shows a random bit circuit 700 according to one embodiment of the present invention. The random bit circuit 700 and the random bit circuit 600 have similar structures and can be operated by similar principles. However, the random bit circuit 700 further includes storage cells SC9A, SC10A, SC11A, SC12A, SC13A, SC14A, SC15A and SC16A. The storage cell SC9A has a first terminal, a second terminal, and a control terminal coupled to a word line WL9. The storage cell SC10A has a first terminal, a second terminal, and a control terminal coupled to a word line WL10. The storage cell SC11A has a first terminal coupled to the second terminal of the storage cell SC10A, a second terminal, and a control terminal coupled to a word line WL11. The storage cell SC12A has a first terminal coupled to the second terminal of the storage cell SC9A, a second terminal, and a control terminal coupled to a word line WL12. The storage cell SC13A has a first terminal coupled to the source line SL, a second terminal coupled to the first terminal of the storage cell SC10A, and a control terminal coupled to a word line WL13. The storage cell SC14A has a first terminal coupled to the source line SL, a second terminal coupled to the first terminal of the storage cell SC9A, and a control terminal coupled to a word line WL14. The storage cell SC15A has a first terminal coupled to the second terminal of the storage cell SC12A, a second terminal coupled to the bit line BL, and a control terminal coupled to a word line WL15. The storage cell SC16A has a first terminal coupled to the second terminal of the storage cell SC11A, a second terminal coupled to the bit line BL, and a control terminal coupled to a word line WL16.

In this case, the storage cells SC5A, SC2A, SC3A, and SC8A are in the same branch B1, and the storage cells SC6A, SC1A, SC4A, and SC7A are in the same branch B2. Also, the storage cells SC13A, SC10A, SC11A, and SC16A are in the same branch B3, and the storage cells SC14A, SC9A, SC12A, and SC15A are in the same branch B4. Furthermore, the storage cells SC13A, SC9A, SC11A, and SC15A are disposed sequentially along the second direction Y, and the storage cells SC14A, SC10A, SC12A, and SC16A are disposed sequentially along the second direction Y. The storage cells SC13A, SC5A, SC6A, and SC14A are disposed sequentially along the first direction X.

Since the storage cells SC1A to SC16A can cover a wider range along both the directions X and Y, the random bit circuit 700 can have better immunity against the process gradient in terms of generating unpredictable random bits.

Furthermore, in some other embodiments, by keeping the centroid symmetrical structure, the random bit circuit 700 can further include more branches of storage cells and/or include more storage cells in each branch so as to have better immunity against the process gradient.

In summary, the random bit circuit provided by the embodiments of the present invention can include storage cells disposed in different branches and arranged in a centroid symmetrical manner; therefore, the programming tendencies of the storage cells caused by process gradient across different positions can be compensated. That is, the random bit circuit can have a better immunity against the process gradient in terms of generating unpredictable random bits, thereby improving the system security that adopts the random bits.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A random bit circuit comprising:
a first storage cell having a first terminal, a second terminal, and a control terminal coupled to a first word line;
a second storage cell having a first terminal, a second terminal, and a control terminal coupled to a second word line;
a third storage cell having a first terminal coupled to the second terminal of the second storage cell, a second terminal, and a control terminal coupled to a third word line;
a fourth storage cell having a first terminal coupled to the second terminal of the first storage cell, a second terminal, and a control terminal coupled to a fourth word line;
a fifth storage cell having a first terminal coupled to a source line, a second terminal, and a control terminal coupled to a fifth word line;
a sixth storage cell having a first terminal coupled to the source line, a second terminal, and a control terminal coupled to a sixth word line;
a seventh storage cell having a first terminal coupled to the second terminal of the sixth storage cell, a second terminal coupled to a bit line, and a control terminal coupled to a seventh word line; and
an eighth storage cell having a first terminal coupled to the second terminal of the fifth storage cell, a second terminal coupled to the bit line, and a control terminal coupled to an eighth word line;
wherein:
the first storage cell and the second storage cell are adjacent to each other and disposed along a first direction;
the first storage cell and the third storage cell are adjacent to each other and disposed along a second direction perpendicular to the first direction;
the third storage cell and the fourth storage cell are adjacent to each other and disposed along the first direction;
the first terminal of the first storage cell and the first terminal of the second storage cell are coupled to the source line; and
the second terminal of the third storage cell and the second terminal of the fourth storage cell are coupled to the bit line.

2. The random bit circuit of claim 1, wherein during an enroll operation:
the source line is configured to receive a program voltage;
the bit line is configured to receive a system reference voltage; and
the first word line, the second word line, the third word line and the fourth word line are configured to receive an operation voltage.

3. The random bit circuit of claim 2 further comprising a voltage control circuit coupled to the second terminal of the first storage cell, the second terminal of the second storage cell, the first word line, the second word line, the third word line, and the fourth word line, and configured to:
detect a voltage at the second terminal of the first storage cell and a voltage at the second terminal of the second storage cell during the enroll operation;
apply a disable voltage to the first word line and the fourth word line to turn off the first storage cell and the fourth storage cell when the voltage at the second terminal of the second storage cell changes; and
apply the disable voltage to the second word line and the third word line to turn off the second storage cell and the third storage cell when the voltage at the second terminal of the first storage cell changes.

4. The random bit circuit of claim 1, wherein during a read operation:
the source line is configured to receive a read voltage;
the bit line is configured to receive a system reference voltage;
the first word line and the fourth word line are configured to receive an operation voltage;
the second word line and the third word line are configured to receive a disable voltage; and
a random bit is read by sensing a current on the bit line.

5. The random bit circuit of claim 1, wherein the first storage cell is a resistive random-access memory (ReRAM) cell and comprises:
a resistive element having a top electrode coupled to the first terminal of the first storage cell, a bottom electrode, and a variation resistance layer disposed between the top electrode and the bottom electrode; and
a select transistor having a first terminal coupled to the bottom electrode of the resistive element, a second terminal coupled to the second terminal of the first storage cell, and a control terminal coupled to the control terminal of the first storage cell.

6. The random bit circuit of claim 1, wherein the first storage cell is a magnetic random-access memory (MRAM) cell and comprises:
a magnetic element having a free layer coupled to the first terminal of the first storage cell, a pinned layer, and a tunnel barrier layer disposed between the free layer and the pinned layer; and
a select transistor having a first terminal coupled to the pinned layer of the magnetic element, a second terminal coupled to the second terminal of the first storage cell, and a control terminal coupled to the control terminal of the first storage cell.

7. The random bit circuit of claim 1, wherein the first storage cell is a flash memory cell and comprises:
a stacked gate transistor having a first terminal coupled to the first terminal of the first storage cell, a second terminal, and a control gate terminal; and
a select transistor having a first terminal coupled to the second terminal of the stacked gate transistor, a second terminal coupled to the second terminal of the first storage cell, and a control terminal coupled to the control terminal of the first storage cell.

8. The random bit circuit of claim 1, wherein the first storage cell comprises:
a select transistor having a first terminal coupled to the first terminal of the first storage cell, a second terminal, and a control terminal coupled to the control terminal of the first storage cell; and
a floating gate transistor having a first terminal coupled to the second terminal of the select transistor, a second terminal coupled to the second terminal of the first storage cell, and a floating gate terminal.

9. The random bit circuit of claim 1, wherein:
the fifth storage cell, the first storage cell, the second storage cell, and the sixth storage cell are disposed sequentially along the first direction; and
the seventh storage cell, the third storage cell, the fourth storage cell, and the eighth storage cell are disposed sequentially along the first direction.

10. A random bit circuit comprising:
a first storage cell having a first terminal, a second terminal, and a control terminal coupled to a first word line;
a second storage cell having a first terminal, a second terminal, and a control terminal coupled to a second word line;
a third storage cell having a first terminal coupled to the second terminal of the second storage cell, a second terminal, and a control terminal coupled to a third word line;
a fourth storage cell having a first terminal coupled to the second terminal of the first storage cell, a second terminal, and a control terminal coupled to a fourth word line;
a fifth storage cell having a first terminal, a second terminal coupled to the first terminal of the second storage cell, and a control terminal coupled to a fifth word line;
a sixth storage cell having a first terminal, a second terminal coupled to the first terminal of the first storage cell, and a control terminal coupled to a sixth word line;
a seventh storage cell having a first terminal coupled to the second terminal of the fourth storage cell, a second terminal, and a control terminal coupled to a seventh word line; and
an eighth storage cell having a first terminal coupled to the second terminal of the third storage cell, a second terminal, and a control terminal coupled to an eighth word line;
wherein:
the first storage cell and the second storage cell are adjacent to each other and disposed along a first direction;
the first storage cell and the third storage cell are adjacent to each other and disposed along a second direction perpendicular to the first direction; and
the third storage cell and the fourth storage cell are adjacent to each other and disposed along the first direction.

11. The random bit circuit of claim 10, wherein:
the fifth storage cell, the first storage cell, the third storage cell, and the seventh storage cell are disposed sequentially along the second direction; and
the sixth storage cell, the second storage cell, the fourth storage cell, and the eighth storage cell are disposed sequentially along the second direction.

12. The random bit circuit of claim 11 further comprising:
a ninth storage cell having a first terminal, a second terminal, and a control terminal coupled to a ninth word line;
a tenth storage cell having a first terminal, a second terminal, and a control terminal coupled to a tenth word line;
an eleventh storage cell having a first terminal coupled to the second terminal of the tenth storage cell, a second terminal, and a control terminal coupled to an eleventh word line;
a twelfth storage cell having a first terminal coupled to the second terminal of the ninth storage cell, a second terminal, and a control terminal coupled to a twelfth word line;
a thirteenth storage cell having a first terminal, a second terminal coupled to the first terminal of the tenth storage cell, and a control terminal coupled to a thirteenth word line;
a fourteenth storage cell having a first terminal, a second terminal coupled to the first terminal of the ninth storage cell, and a control terminal coupled to a fourteenth word line;
a fifteenth storage cell having a first terminal coupled to the second terminal of the twelfth storage cell, a second terminal, and a control terminal coupled to a fifteenth word line; and
a sixteenth storage cell having a first terminal coupled to the second terminal of the eleventh storage cell, a second terminal, and a control terminal coupled to a sixteenth word line.

13. The random bit circuit of claim 12, wherein:
the thirteenth storage cell, the ninth storage cell, the eleventh storage cell, and the fifteenth storage cell are disposed sequentially along the second direction;
the fourteenth storage cell, the tenth storage cell, the twelfth storage cell, and the sixteenth storage cell are disposed sequentially along the second direction; and
the thirteenth storage cell, the fifth storage cell, the sixth storage cell, and the fourteenth storage cell are disposed sequentially along the first direction.

* * * * *